United States Patent
Taniguchi et al.

(10) Patent No.: US 10,014,162 B2
(45) Date of Patent: Jul. 3, 2018

(54) PLASMA GENERATION APPARATUS FOR GENERATING TOROIDAL PLASMA

(71) Applicant: DAIHEN Corporation, Osaka-shi, Osaka (JP)

(72) Inventors: Michio Taniguchi, Osaka (JP); Shigeki Amadatsu, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 15/247,517

(22) Filed: Aug. 25, 2016

(65) Prior Publication Data
US 2017/0062183 A1    Mar. 2, 2017

(30) Foreign Application Priority Data
Aug. 28, 2015 (JP) .................. 2015-168894

(51) Int. Cl.
*H01J 37/32* (2006.01)

(52) U.S. Cl.
CPC ........ *H01J 37/321* (2013.01); *H01J 37/3266* (2013.01); *H01J 37/32339* (2013.01); *H01J 37/32458* (2013.01); *H01J 37/32513* (2013.01); *H01J 2237/327* (2013.01); *H01J 2237/332* (2013.01); *H01J 2237/334* (2013.01)

(58) Field of Classification Search
CPC ............... H01J 37/321; H01J 37/32339; H01J 37/32458; H01J 37/3266
USPC .................................... 315/111.51
See application file for complete search history.

(56) References Cited

U.S. PATENT DOCUMENTS

| | | | | |
|---|---|---|---|---|
| 6,150,628 A | * | 11/2000 | Smith | H01J 27/16 156/345.28 |
| 6,924,455 B1 | * | 8/2005 | Chen | H01J 27/16 204/298.31 |
| 2009/0290673 A1 | * | 11/2009 | Svidzinski | G21B 1/05 376/133 |
| 2014/0062285 A1 | * | 3/2014 | Chen | H05H 1/24 313/231.31 |
| 2014/0130980 A1 | * | 5/2014 | Lee | H05H 1/46 156/345.29 |
| 2015/0303031 A1 | * | 10/2015 | Choi | H05H 1/46 315/111.51 |
| 2016/0163512 A1 | * | 6/2016 | Lubomirsky | H01J 37/3244 438/798 |

FOREIGN PATENT DOCUMENTS

JP    4070152 A    1/2008

* cited by examiner

*Primary Examiner* — Dylan White
(74) *Attorney, Agent, or Firm* — Hamre, Schumann, Mueller & Larson, P.C.

(57) ABSTRACT

An inductive-coupling plasma generation apparatus in which coupling can be made stronger and power can be used more effectively than in a conventional technique. The inductive-coupling plasma generation apparatus includes an electroconductive chamber with a toroidal-shaped electrical discharge space formed inside. The plasma generation apparatus also includes a high-frequency power source connected to the chamber. The power source is configured to cause a high-frequency current to flow through electroconductive material forming the chamber along a toroidal direction.

12 Claims, 7 Drawing Sheets

PLASMA GENERATION APPARATUS FOR GENERATING TOROIDAL PLASMA

BACKGROUND OF THE INVENTION

1. Field of the Invention

The present invention relates to a plasma generation apparatus for generating toroidal plasma.

2. Description of Related Art

An electric field-coupling plasma generation apparatus and an inductive-coupling plasma generation apparatus are known as apparatuses for generating plasma for plasma processing. The electric field-coupling plasma generation apparatus adds a high-frequency electric field to a material gas in a chamber using an electrode so as to generate plasma. On the other hand, the inductive-coupling plasma generation apparatus generates a high-frequency magnetic field by allowing a high-frequency current to flow in an induction coil and generates a high-frequency electric field in a chamber using the high-frequency magnetic field, whereby the material gas in the chamber becomes plasma. The material gas subjected to plasma generation is used in plasma processing as a reactive gas.

For example, Japanese Patent No. 4070152 discloses an inductive-coupling plasma generation apparatus for generating toroidal plasma. Note that "toroidal plasma" is plasma in a toroidal shape. The plasma generation apparatus allows a high-frequency current to flow in a primary winding wrapped around a magnetic core surrounding a portion of the chamber, and thereby causes magnetic flux in the magnetic core to change, thus generating a high-frequency electric field in the chamber.

However, in the case of using the plasma generation apparatus disclosed in Japanese Patent No. 4070152, the chamber and the primary winding are arranged such that their positions are physically separate, and a secondary circuit formed by the plasma in the chamber and the primary winding have separate positions. Accordingly, the coupling force decreases due to magnetic flux leakage.

SUMMARY OF THE INVENTION

The present invention has been proposed in view of the foregoing circumstances. It is therefore an object of the invention to provide an inductive-coupling plasma generation apparatus according to which coupling can be made stronger and power can be used more effectively than in the conventional technique.

According to an aspect of the present invention, there is provided a plasma generation apparatus that includes: a chamber made of an electroconductive material and having a toroidal-shaped electrical discharge space; and a power source connected to the chamber for causing a current to flow through the chamber along a toroidal direction.

Preferably, the chamber may be provided with at least one insulating portion, and thus the chamber may include a first portion and a second portion that are electrically insulated from each other in the toroidal direction via the insulating portion.

Preferably, the plasma generation apparatus may further include a first connecting line and a second connecting line, and the power source may be provided with a first output terminal and a second output terminal. The first connecting line may connect the first output terminal to the first portion of the chamber, while the second connecting line may connect the second output terminal to the second portion of the chamber.

With the above-noted plasma generation apparatus, a current (typically a high-frequency current) outputted from the power source flows in the chamber in the toroidal direction. Accordingly, a magnetic flux passing through the center of the chamber changes, and an electric field in the toroidal direction is generated in the electrical discharge space inside of the chamber. Due to the electric field, material gas introduced into the chamber becomes plasma, and thus toroidal plasma is generated. A plasma current flows in the toroidal direction in the electric discharge space inside the chamber. There is a route in which the plasma current flows, and this route is provided inside of another route in which the high-frequency current (excitation current) flows. Both routes are close to each other, and the central axes of the two routes are substantially the same. Accordingly, magnetic flux leakage can be reduced, and the coupling can be strengthened. Thus, the power outputted by the high-frequency power source can be used effectively.

Other features and advantages of the present invention will become more apparent from the detailed description given below with reference to the accompanying drawings.

DETAILED DESCRIPTION OF THE PREFERRED EMBODIMENTS

Preferred embodiments of the present invention will be described below with reference to the accompanying drawings.

Figure 1:
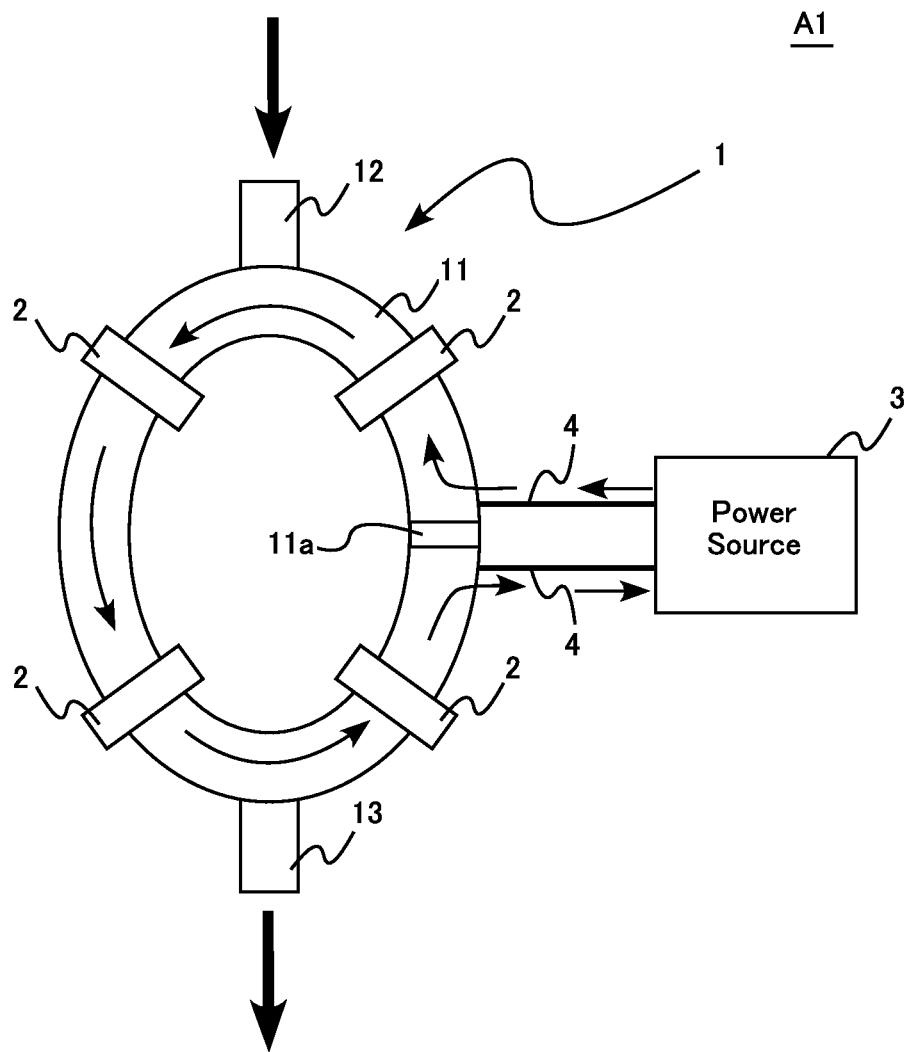
FIG. 1 is a simplified conceptual diagram showing the entirety of a plasma generation apparatus according to a first embodiment.
Figure 2A:
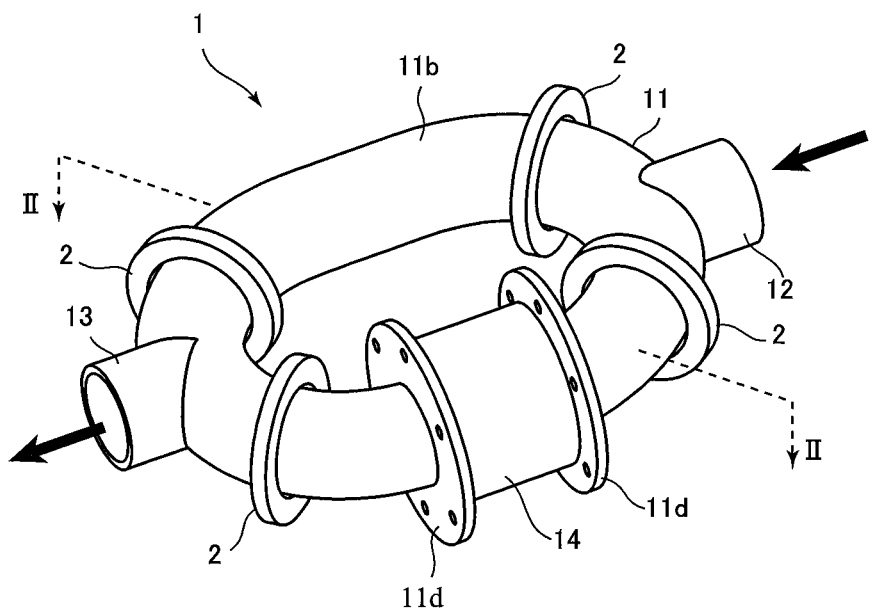
FIGS. 2A and 2B are diagrams for illustrating a chamber used in the first embodiment.
Figure 2B:
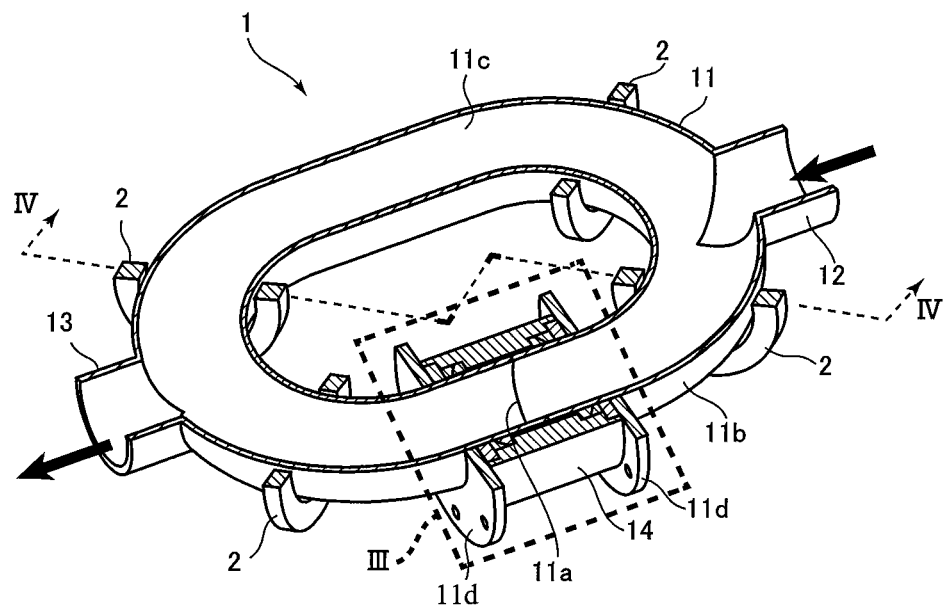
Figure 3A:
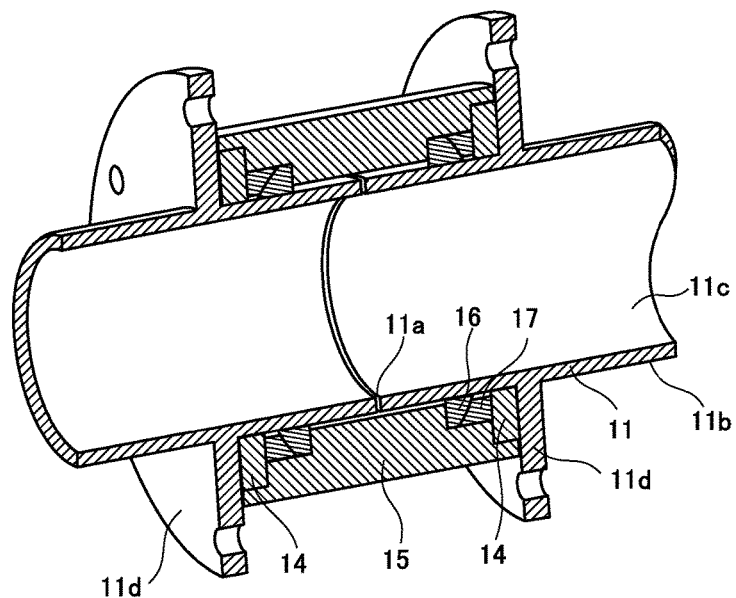
FIGS. 3A and 3B are enlarged views of a portion surrounded by a broken line III shown in FIG. 2B.
Figure 3B:
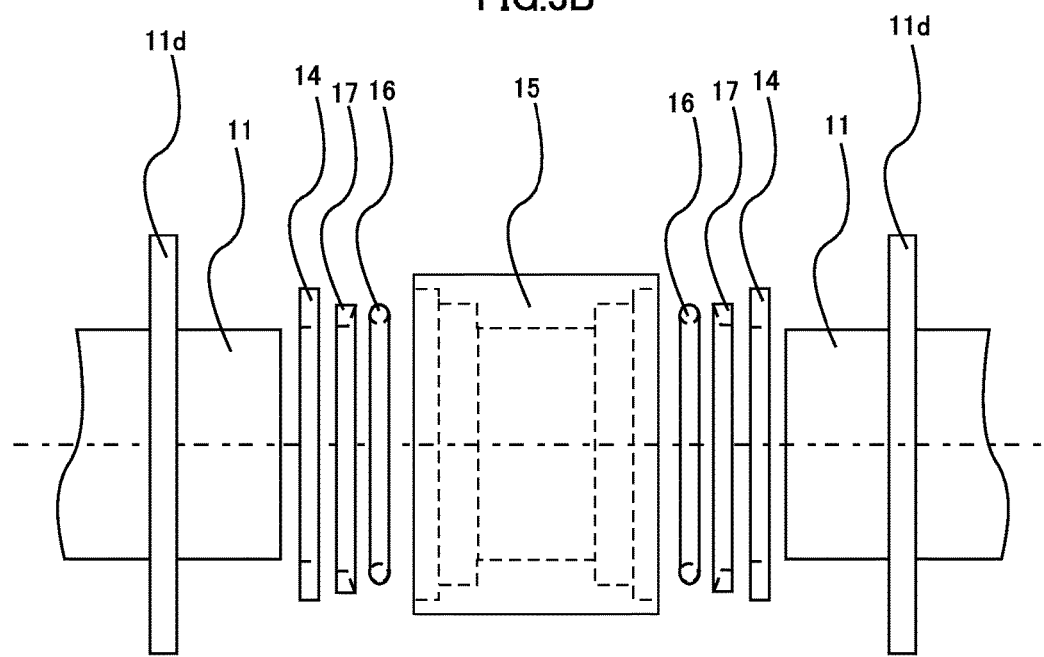
Figure 4:
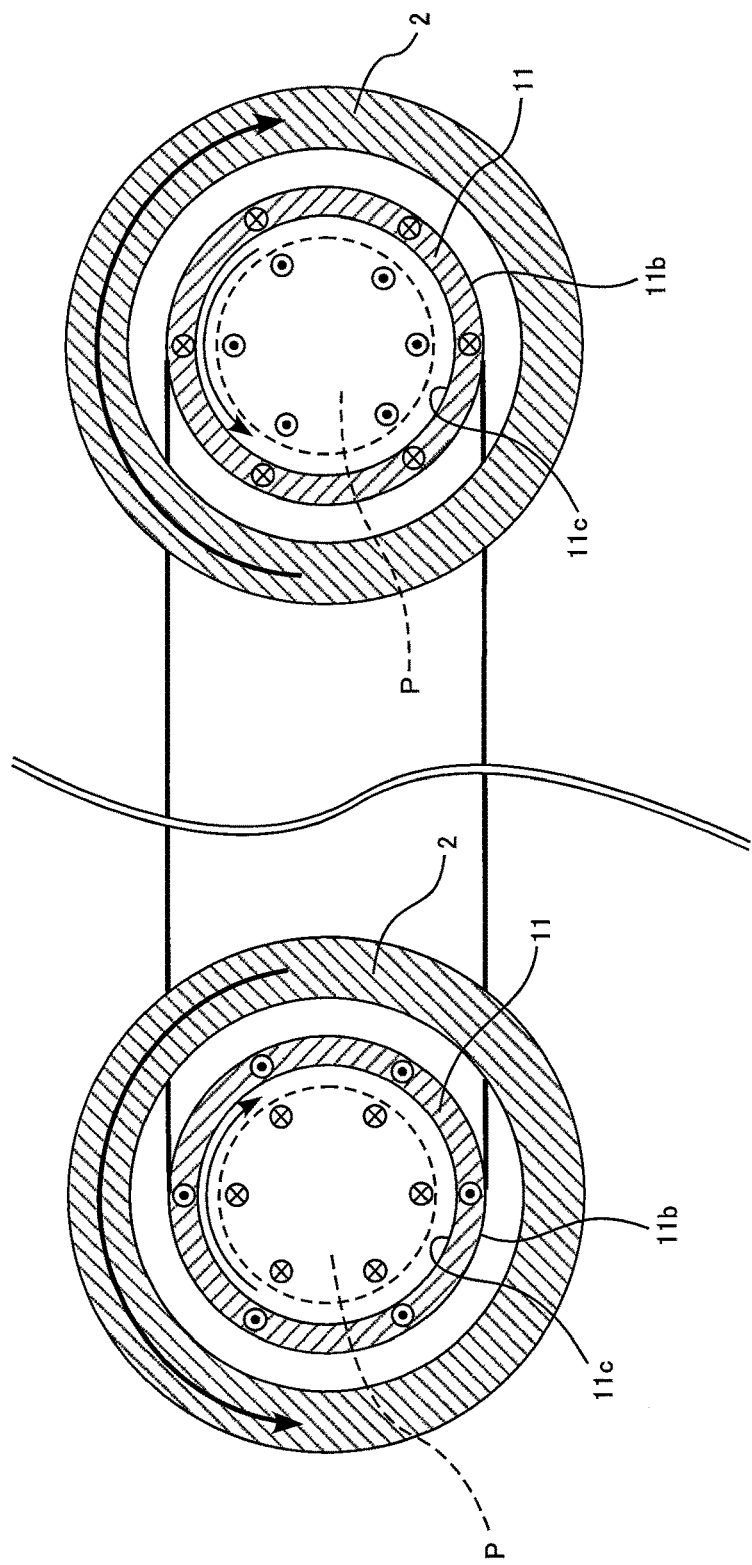
FIG. 4 is a cross-sectional view taken along line IV-IV in FIG. 2B.

FIGS. 1 to 4 are diagrams for illustrating a plasma generation apparatus according to a first embodiment. FIG. 1 is a simplified conceptual diagram showing the entirety of the plasma generation apparatus according to the first embodiment. FIGS. 2A and 2B are diagrams for illustrating a chamber used in the first embodiment. FIG. 2A is an external perspective view of the chamber, and FIG. 2B is a cross-sectional view taken along line II-II in FIG. 2A. FIGS. 3A and 3B are diagrams for illustrating an insulating gap. FIG. 3A is an cross-sectional enlarged view of a portion surrounded by a broken line III shown in FIG. 2B. FIG. 3B is an exploded view of the portion. FIG. 4 is a cross-sectional view taken along line IV-IV in FIG. 2B.

The plasma generation apparatus A1 is an inductive-coupling plasma generation apparatus that generates a high-frequency electric field in an electrical discharge space with a toroidal shape using electromagnetic inductance so as to turn a material gas introduced to the electric discharge space into plasma and generate toroidal plasma. The plasma generation apparatus A1 discharges the material gas that was turned into plasma to a plasma processing step such as thin film formation processing or etching processing, as a reactive gas. As shown in FIG. 1, the plasma generation apparatus A1 includes a chamber 1, at least one magnetic core 2 (four cores shown in the figure), a high-frequency power source 3, and connection lines (such as wires and cables) 4.

The chamber 1 has an electrical discharge space with a toroidal shape and generates toroidal plasma. As shown in FIG. 2, a main body 11 of the chamber 1 has a toroidal shape obtained by forming a pipe with an approximately circular cross section orthogonal to an axis into an oval shape. The chamber 1 includes an inlet port 12, which is an opening for introducing the material gas into the main body 11, and an outlet port 13, which is an opening for discharging the reactive gas, which is the material gas that has become plasma, from the main body 11. In the present embodiment, the position of the inlet port 12 and the position of the outlet port 13 are at opposing positions in the main body 11 of the chamber 1 such that the two routes through which the material gas passes have equal lengths. Note that the position of the inlet port 12 and the position of the outlet port 13 are not limited to this. The chamber 1 is made of a metal such as aluminum. Note that there is no limitation on the material of the chamber 1, and another metal such as copper or iron may be used. Also, it is sufficient to use a material that has a certain degree of strength and allows current to flow, and for example, it is possible to use a conductor such as a superconducting ceramic or carbon. Also, the cross section of the main body 11 of the chamber 1 (cross section orthogonal to the axis in the toroidal direction) is not limited to having an approximately circular shape, and may have an oval shape, an elliptical shape, or a polygonal shape such as a quadrangular shape.

The main body 11 of the chamber 1 is provided with an insulating gap 11a (see FIGS. 1, 3A, and 3B), whereby the main body 11 has two opposing end portions that are spaced apart from each other in the toroidal direction. As shown in FIGS. 3A-3B, the insulating gap 11a is a portion at which a gap is maintained using two flanges 11d, insulating spacers 14 and a relay adapter 15. In the illustrated embodiment, the flanges 11d are provided on an outer wall 11b of the main body 11 (one flange being provided on one of the two opposing end portions, and the other flange on the other end portion), and the insulating spacers 14 and the relay adapter 15 are arranged between the two flanges 11d. In this manner, the separated portions of the main body 11 are electrically insulated from each other.

The insulating spacers 14 are insulating ceramic rings, for example, and are arranged such that the separated portions of the main body 11 of the chamber 1 are inserted therein, and so that the insulating spacers 14 come into contact with the flanges 11d. The insulating spacers 14 prevent the main body 11 and the relay adapter 15 from coming into contact with each other and electrically insulate the main body 11 and the relay adapter 15. Two insulating spacers 14 are used because they are arranged on both sides of the separated portions of the main body 11. Note that there is no limitation on the material of the insulating spacers 14, and it is sufficient to use an insulator having a rigidity that can cause a space to be formed between the main body 11 and the relay adapter 15.

The relay adapter 15 connects the separated portions of the main body 11 of the chamber 1 while maintaining the insulating gap 11a. The relay adapter 15 is, for example, a wide ring made of aluminum whose inside portion is formed with a through-hole having a stepped shape. The separated portions of the main body 11 are inserted from both sides of the relay adapter 15, and then the flanges 11d on both sides are fixed to each other by bolts and nuts, for example. The gap between the flanges 11d on both sides is defined by the relay adapter 15 and the two insulating spacers 14, and the separated portions of the main body 11 are fixed with a predetermined gap therebetween. The predetermined gap is the insulating gap 11a.

Also, in order to tightly seal the main body 11 of the chamber 1, an O-ring 16 and an O-ring pressure ring 17 are arranged between the relay adapter 15 and the insulating spacer 14.

The O-ring 16 is a ring made of fluorine-based rubber, for example. The O-ring 16 is arranged between the insulating spacer 14 and the relay adapter 15 with the separated portion of the main body 11 of the chamber 1 inserted therein. The O-ring 16 deforms to come into close contact with the inner surface of the relay adapter 15 and the outer wall 11b of the main body 11, and keeps the main body 11 tightly sealed. Note that there is no limitation on the material of the O-ring 16, and it is sufficient to use an insulator that is elastic and can tightly seal the gap between the inner surface of the relay adapter 15 and the outer wall 11b of the main body 11. Also, it is preferable to use a material that is chemically stable and has high thermal resistance.

The O-ring pressure ring 17 is a ring made of Teflon (registered trademark), for example. The O-ring pressure ring 17 is arranged between the insulating spacer 14 and the O-ring 16 with the separated portion of the main body 11 of the chamber 1 inserted therein. The O-ring pressure ring 17 is wider on the outside than on the inside, and is provided with a slope on the side that comes into contact with the O-ring 16. The O-ring pressure ring 17 applies pressure to the O-ring 16 due to the slope so as to prompt deformation, thereby strengthening the property of close contact between the relay adapter 15 and the main body 11 of the O-ring 16. Note that there is no limitation on the material of the O-ring pressure ring 17, and it is sufficient to use an insulator having a rigidity according to which pressure can be applied to the O-ring 16. Also, it is preferable to use a material that is chemically stable and has high thermal resistance. Also, the slope on the side that comes into contact with the O-ring 16 is not necessarily needed.

Two each of the O-ring 16 and the O-ring pressure ring 17 are used because they are arranged on both sides of the separated portions of the main body 11. Note that the configuration of the O-ring 16 and the O-ring pressure ring 17 is not limited to the description above. It is sufficient to use a configuration in which the O-ring 16 is deformed by applying pressure to the O-ring 16 using the O-ring pressure ring 17 so as to keep the main body 11 tightly sealed. Also, if the main body 11 can be kept tightly sealed using only the O-ring 16, it is possible to not include the O-ring pressure ring 17. Also, it is possible to arrange a member that is highly resistant to the reactive gas generated inside of the main body 11 on the insulating gap 11a side with respect to the O-ring 16 so as to protect the O-ring 16.

As shown in FIG. 3A, the O-ring 16 and the O-ring pressure ring 17 are arranged at positions separated from the insulating gap 11a, and therefore they are less likely to be exposed to the reactive gas, thereby suppressing a case in which the O-ring 16 and the O-ring pressure ring 17 deteriorate due to the reactive gas.

In the present embodiment, a gap of about several millimeters is used as the insulating gap 11a. The larger the insulating gap 11a is, the easier it is to maintain insulation, but the easier it is for the reactive gas to enter the outer side of the insulating gap 11a, making it more likely that the O-ring 16 and the O-ring pressure ring 17 will deteriorate. Accordingly, it is preferable to make the insulating gap 11a as small as possible within a range in which insulation can be maintained. In the present embodiment, the size of the insulating gap 11a is determined according to the length in the axis direction of the relay adapter 15. Accordingly, the size of the insulating gap 11a can be changed easily by exchanging the relay adapter 15.

Note that the structure for maintaining the insulating gap 11a is not limited to this. In the present embodiment, the relay adapter 15 is made of aluminum, and therefore the insulating spacers 14 are arranged such that the relay adapter 15 and the main body 11 do not come into contact, but there is no need to arrange the insulating spacers 14 if the relay adapter 15 is made of an insulating material. Also, even if another structure is used, it is sufficient that the insulating gap 11a can be maintained and the main body 11 can be tightly sealed. Note that since it is sufficient that the main body 11 can be tightly sealed and can be electrically insulated, instead of providing the insulating gap 11a, for example, it is also possible to connect the separated portions of the main body 11 using insulating resin or the like that is highly resistant to reactive gas.

The magnetic core 2 is a ferromagnetic core with a toroidal shape. Four magnetic cores 2 are provided so as to surround respective portions of the main body 11 of the chamber 1 (such that the main body 11 penetrates each magnetic core 2). Note that there is no limitation on the shape of the magnetic cores 2, and it is possible to use a quadrangular ring shape.

The high-frequency power source 3 is for outputting high-frequency power, and converts AC power from a power system into DC power using a rectifying circuit, converts the DC power into high-frequency power using an inverter circuit, and outputs the high-frequency power. Also, the high-frequency power source 3 includes a control circuit and controls the output power and output current. In the present embodiment, the high-frequency power source 3 outputs high-frequency power of 13.56 MHz, for example. Note that there is no limitation on the configuration and frequency of the high-frequency power source 3.

The connection lines 4 are for connecting the output terminals of the high-frequency power source 3 and the chamber 1. One connection line 4 connects one output terminal of the high-frequency power source 3 and one flange 11d (not shown in FIG. 1) of the chamber 1, and the other connection line 4 connects the other output terminal of the high-frequency power source 3 and the other flange 11d (not shown in FIG. 1) of the chamber 1. The main body 11 of the chamber 1 is electrically insulated between the two flanges 11d due to the insulating gap 11a. Accordingly, the current route indicated by the thin arrows in FIG. 1 is formed, and a high-frequency current outputted by the high-frequency power source 3 flows in the toroidal direction in the main body 11 of the chamber 1. Note that the connection lines 4 may be connected to the outer wall 11b of the chamber 1 instead of the flanges 11d.

Note that the plasma generation apparatus A1 may also include an electrode that applies a high-voltage pulse for igniting the plasma. The plasma may also be ignited by ultraviolet irradiation. In these cases, ignition of the plasma can be performed easily. Also, the plasma may be ignited in same manner as in the third to fifth embodiments, which will be described later.

The plasma generation apparatus A1 also includes a sensor for detecting the current and power of the plasma inside of the main body 11 of the chamber 1, a sensor for detecting light emitted by the plasma, and the like. The high-frequency power source 3 may control the output in accordance with the detection result of the sensor.

It is also possible to arrange an impedance adjustment device between the high-frequency power source 3 and the chamber 1 so as to adjust the impedance of the entire load viewed from the high-frequency power source 3 to a desired impedance.

Next, the method for generating plasma will be described.

The material gas is introduced to the inside of the main body 11 of the chamber 1 through the inlet port 12. The material gas is phosphorous gas or the like, for example, but there is no limitation thereto.

The magnetic flux that passes through the inner portions of the magnetic cores 2 changes due to the high-frequency current flowing in the toroidal direction in the main body 11 of the chamber 1. Due to the changes in the magnetic flux in the magnetic cores 2, an electric field in the toroidal direction is generated in the electrical discharge space inside of the main body 11 of the chamber 1. Due to this electric field, the material gas inside of the main body 11 becomes plasma (toroidal plasma is generated), and a plasma current flows in the toroidal direction in the electric discharge space inside of the main body 11 of the chamber 1.

For example, in a cross section of the left side of the main body 11 of the chamber 1 shown in FIG. 4, when the current flows in the main body 11 toward the page surface, a counterclockwise main electromagnetic flux (see the bold-lined arrows shown in FIG. 4) is generated inside of the magnetic core 2. Then, in the electric discharge space inside of the main body 11, an inverse electromotive force that attempts to cancel out the main magnetic flux is induced by electromagnetic induction, and an electric field that moves away from the page surface is generated. At this time, in a cross section of the right side of the main body 11 of the chamber 1 shown in FIG. 4, a current flows away from the page surface in the main body 11, and therefore a clockwise main magnetic flux (see the bold arrow shown in FIG. 4) is generated inside of the magnetic core 2, and an electric field moving toward the page surface is generated in the electric discharge space inside of the main body 11. In other words, an electric field in the toroidal direction is generated in the electrical discharge space inside of the main body 11 of the chamber 1.

The material gas that has become plasma is discharged as a reactive gas through the outlet port 13.

Next, advantages of the plasma generation apparatus A1 according to the present embodiment will be described.

According to the present embodiment, the high-frequency current outputted by the high-frequency power source 3 flows in the toroidal direction in the main body 11 of the chamber 1. Accordingly, the magnetic flux that passes through the inner portions of the magnetic cores 2 changes. Due to the changes in the magnetic flux in the magnetic cores 2, an electric field in the toroidal direction is generated in the electrical discharge space inside of the main body 11 of the chamber 1. Due to this electric field, the material gas inside of the main body 11 becomes plasma, toroidal plasma is generated, and a plasma current flows in the toroidal direction in the electrical discharge space inside of the main body 11 of the chamber 1.

In the present embodiment, the high-frequency current outputted by the high-frequency power source 3 flows in the toroidal direction in the main body 11 of the chamber 1, and the plasma current flows in the toroidal direction in the electric discharge space inside of the main body 11 of the chamber 1. That is, there is a route in which the plasma current flows inside of the route in which the high-frequency current (excitation current) flows, the two routes are close to each other, and the central axes of the two routes are substantially the same. As shown in FIG. 4, magnetic flux leakage (see thin arrows) occurs only in a plasma sheath portion between the inner wall 11c of the main body 11 of the chamber 1 and toroidal plasma P. The plasma sheath portion is a narrow region with high magnetic resistance, and therefore only extremely slight magnetic flux leakage occurs. Accordingly, magnetic flux leakage can be reduced, and the coupling can be strengthened. Accordingly, the power outputted by the high-frequency power source 3 can be used effectively. Also, no primary winding for changing the magnetic flux is necessary, and therefore the installation space for the primary winding can be omitted, and the plasma generation apparatus A1 can be made smaller. Also, the manufacturing cost can be reduced.

Also, in the present embodiment, the magnetic cores 2 are provided, and the magnetic flux passes through the magnetic cores 2, which have little magnetic resistance, and therefore the excitation current needed for generating the same magnetic flux decreases. Accordingly, the high-frequency current output from the high-frequency power source 3 can be suppressed. Also, because the current that flows in the main body 11 of the chamber 1 can be reduced, it is possible to suppress heat generation in the chamber 1.

Note that in the above-described first embodiment, a case is described in which four magnetic cores 2 are provided, but there is no limitation thereto, and the number of magnetic cores 2 may be designed as appropriate according to the cross-sectional area of the magnetic cores 2. Also, in a case where the high-frequency power source 3 outputs a high-frequency current with a high frequency or the like, it is possible to not provide the magnetic cores 2. In the case of this modified example as well, when the high-frequency current flows in the toroidal direction through the main body 11 of the chamber 1, the magnetic flux that passes through the toroidal center of the main body 11 changes, and therefore an electric field in the toroidal direction is generated and toroidal plasma is generated in the electrical discharge space inside of the main body 11 of the chamber 1. Accordingly, in this modified example as well, an effect similar to that of the first embodiment can be achieved. Also, in the case of the present modified example, there is no need to provide the magnetic cores 2, and therefore the plasma generation apparatus A1 can be made even smaller, and the manufacturing cost can be reduced.

Figure 5:
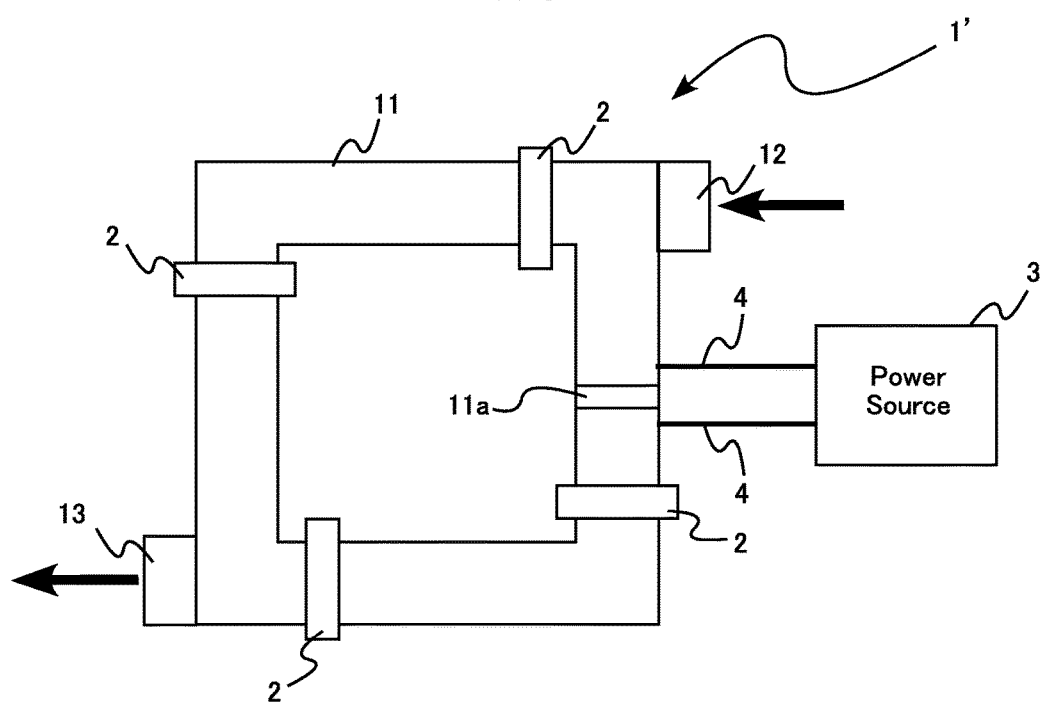
FIG. 5 is a diagram showing a modified example of a chamber.

In the above-described first embodiment, a case is described in which the main body 11 of the chamber 1 has an ovoid toroidal shape, but there is no limitation thereto. The main body 11 may have a circular or elliptical toroidal shape, for example. Also, it is possible to use a quadrangular ring shape, as with the chamber 1' shown in FIG. 5, and it is possible to use an approximately quadrangular ring shape obtained by rounding the corner portions of the quadrangular shape. It is also possible to use another polygonal ring shape. In these cases as well, the toroidal plasma can be generated in the electrical discharge space inside of the main body 11. Accordingly, in this modified example as well, an effect similar to that of the first embodiment can be achieved.

In the case of using the plasma generation apparatus A1 according to the first embodiment, the material gas introduced through the inlet port 12 is divided into two parts, passes through the plasma inside of the main body 11, and is discharged from the outlet port 13. In the vicinity of the insulating gap 11a, a high-frequency electric field caused by a potential difference is generated, and electric field coupling also occurs, and therefore it is easy to generate plasma. Accordingly, the degree of plasma generation of the material gas is different in the case of passing through the insulating gap 11a (route on the right side of the main body 11 shown in FIG. 1) and in the case of not passing through the insulating gap 11a (route on the left side of the main body 11 shown in FIG. 1), and the reactive gas that is discharged is uneven. A case of suppressing this unevenness will be described below as a second embodiment.

Figure 6A:
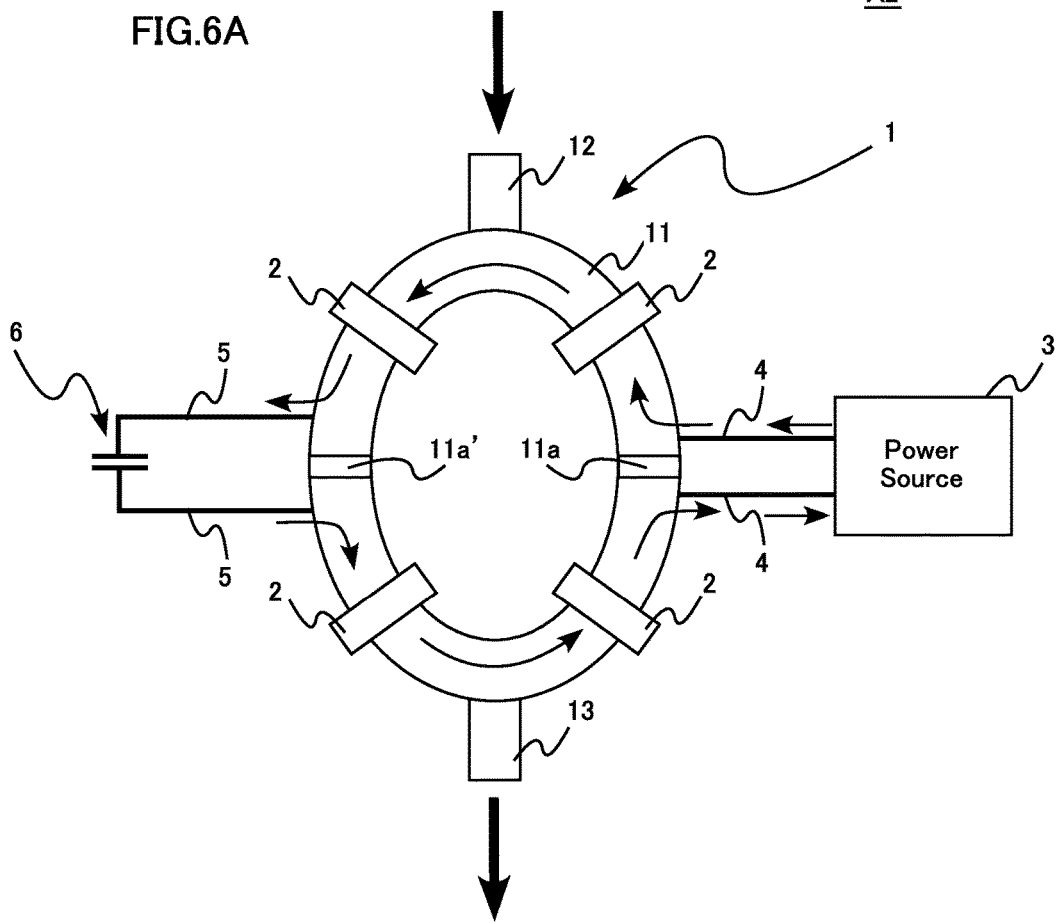
FIGS. 6A and 6B are diagrams for illustrating a plasma generation apparatus according to a second embodiment.
Figure 6B:
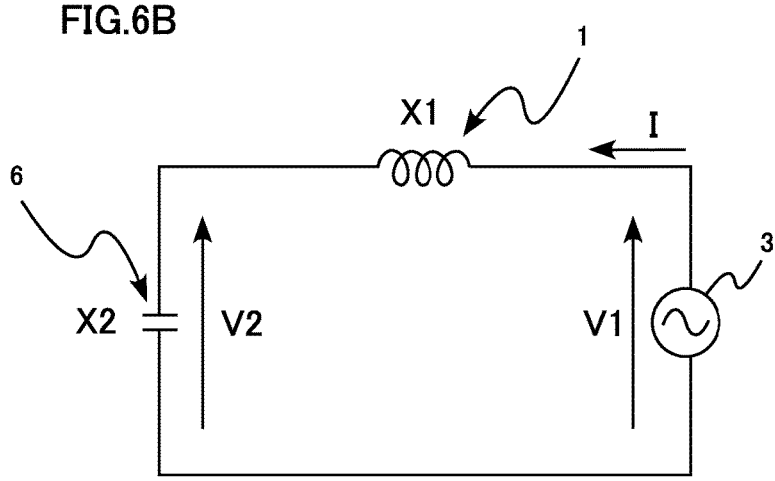

FIGS. 6A and 6B are diagrams for illustrating a plasma generation apparatus according to a second embodiment. FIG. 6A is a simplified conceptual diagram showing the entirety of the plasma generation apparatus according to the second embodiment. In FIG. 6A, elements that are the same as or similar to those of the plasma generation apparatus A1 according to the first embodiment (see FIG. 1) are denoted by the same reference signs. As shown in FIG. 6A, the plasma generation apparatus A2 differs from the plasma generation apparatus A1 according to the first embodiment in that an insulating gap 11a' is added to the main body 11 of the chamber 1 (so that a third end portion and a fourth end portion of the chamber 1 are electrically insulated from each other via the gap 11a'), and in that a capacitor 6 is connected to the main body 11 of the chamber 1 on both sides of the insulating gap 11a'.

The additional insulating gap 11a' is for electrically insulating the main body 11 of the chamber 1, similarly to the insulating gap 11a. The insulating gap 11a' is arranged at an opposing position in the main body 11 of the chamber 1, with respect to the insulating gap 11a. The structure of the periphery of the insulating gap 11a' is also similar to that of the insulating gap 11a (see FIG. 3).

The capacitor 6 is a capacitor with a reactance that is about one half of the reactance of the chamber 1 in the state after plasma has been generated. The capacitor 6 is connected to the main body 11 of the chamber 1 by connection lines 5 on both sides of the insulating gap 11a'. Accordingly, the high-frequency current outputted by the high-frequency power source 3 flows in the current route (thin arrow shown in FIG. 6) formed by the connection line 4, half of the main body 11 of the chamber 1, the capacitor 6, half of the main body 11 of the chamber 1, and the connection line 4.

FIG. 6B shows an equivalence circuit of the plasma generation apparatus A2.

Letting X1 be the reactance of the chamber 1 and X2 be the reactance of the capacitor 6, X2=(½)X1, and therefore the potential difference V1 between the two ends of the insulating gap 11a and the potential difference V2 between the two ends of the insulating gap 11a' are as defined by the following equations. Note that I is the current that flows in the main body 11 of the chamber 1.

$$V1 = j(X1-X2) \times I = j(\tfrac{1}{2})X1 \times I$$

$$V2 = -jX2 \times I = -j(\tfrac{1}{2})X1 \times I$$

That is, |V1|=|V2| is satisfied, and high-frequency electric fields of the same size are generated in the vicinity of the insulating gap 11a and in the vicinity of the insulating gap 11a'. Accordingly, even in the vicinity of the insulating gap 11a', electric field coupling similar to that in the vicinity of the insulating gap 11a occurs.

In the second embodiment as well, it is possible to achieve an effect similar to that of the first embodiment. Furthermore, in the second embodiment, because the electromagnetic coupling that occurs in the vicinity of the insulating gap 11a and the electromagnetic coupling that occurs in the vicinity of the insulating gap 11a' are substantially the same, the degree to which the material gas becomes plasma is similar in the case of passing through the insulating gap 11a (route on the right side of the main body 11 shown in FIG. 6A) and in the case of passing through the insulating gap 11a' (route on the left side of the main body 11 shown in FIG. 6A). Accordingly, it is possible to suppress a case in which the reactive gas to be discharged becomes uneven.

In the second embodiment, a case is described in which the positions of the insulating gap 11a and the insulating gap 11a' are opposing positions in the main body 11 of the chamber 1, but there is no limitation thereto. It is sufficient that the insulating gap 11a is provided intermediately on one of the two routes from the inlet port 12 to the outlet port 13 and the insulating gap 11a' is provided intermediately on the other of the two routes.

Next, as the third to fifth embodiments, a case will be described below in which ignition of plasma is simplified by performing switching before and after plasma generation.

In general, with a plasma generation apparatus for generating plasma using high-frequency power, the impedance of the plasma generation apparatus is significantly different in a state before the plasma is generated and in a state after the plasma is generated. With the plasma generation apparatuses A1 and A2 according to the first and second embodiments as well, the impedance is significantly different in a state before the plasma is generated and in a state after the plasma is generated. In the state after the plasma is generated, as is described in the second embodiment, it is preferable to obtain balance in voltages in the insulating gap 11a and the insulating gap 11a'. On the other hand, in the state before the plasma is generated, it is required that the plasma is easily ignited by applying a high-frequency voltage.

Figure 7A:
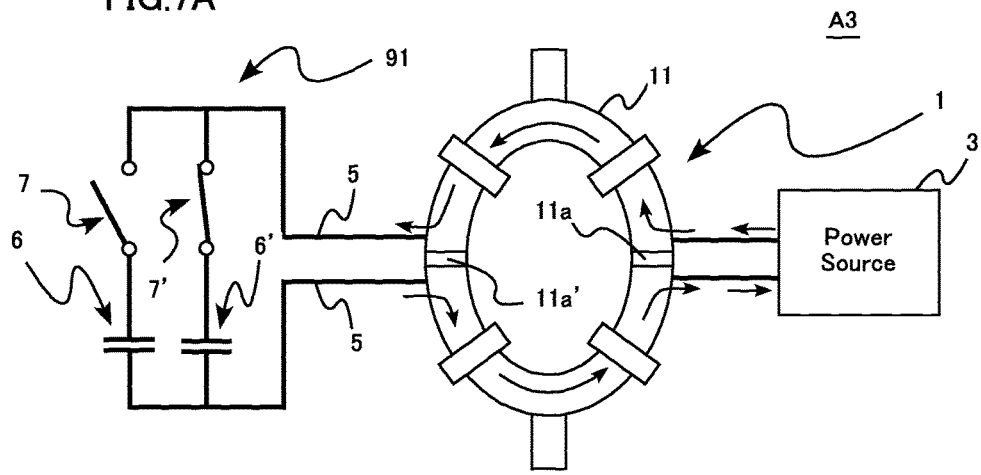
FIGS. 7A to 7C are diagrams for illustrating plasma generation apparatuses according to third to fifth embodiments.

FIG. 7A is a simplified conceptual diagram showing the entirety of the plasma generation apparatus according to the third embodiment. In FIG. 7A, elements that are the same as or similar to those of the plasma generation apparatus A2 according to the second embodiment (see FIG. 6A) are denoted by the same reference signs. As shown in FIG. 7A, the plasma generation apparatus A3 differs from the plasma generation apparatus A2 according to the second embodiment in that instead of the capacitor 6, a circuit 91 for switching between a capacitor 6 and a capacitor 6' is connected.

The circuit 91 is such that the capacitor 6 and switch 7, which are connected in series, and the capacitor 6' and switch 7', which are connected in series, are connected in parallel. The capacitor 6 is similar to the capacitor 6 according to the second embodiment, and is a capacitor whose reactance is one half of the reactance of the chamber 1 in the state after the plasma has been generated. The capacitor 6' is a capacitor whose reactance is substantially the same as the reactance of the chamber 1 in the state before the plasma is generated. The switch 7 is off before the plasma is generated, and is on after the plasma is generated. On the other hand, the switch 7' is on before the plasma is generated and is off after the plasma is generated. In other words, before the plasma is generated, the capacitor 6' enters a state of being connected to the main body 11 of the chamber 1 by the connection lines 5 (state shown in FIG. 7A), and after the plasma is generated, the capacitor 6 enters a state of being connected to the main body 11 of the chamber 1 by the connection lines 5. Note that the switches 7 and 7' may be switched based on the detection result of a sensor that detects the state (current, power, light emitted by plasma) of the plasma inside of the main body 11 of the chamber 1, or the switches 7 and 7' may be switched based on a change in the impedance of a load detected by the high-frequency power source 3.

In the third embodiment, after the plasma is generated, the capacitor 6 enters a state of being connected, and since a configuration similar to that of the second embodiment is used, an effect similar to that of the second embodiment can be achieved. Also, before the plasma is generated, the capacitor 6', whose reactance is substantially the same as the reactance of the chamber 1, enters a state of being connected. Because the reactance of the chamber 1 and the reactance of the capacitor 6' are substantially the same, the chamber 1 and the capacitor 6' enter a series resonance state, and the impedance of the entire load viewed from the high-frequency power source 3 approaches zero. Accordingly, a high voltage is applied between the two ends of the insulating gap 11a', and it is easy to ignite the plasma.

Note that it is possible to include a single-pole double throw switch instead of the switches 7 and 7', and to switch between a state in which the capacitor 6 is connected to the connection lines 5 and a state in which the capacitor 6' is connected to the connection lines 5.

Figure 7B:
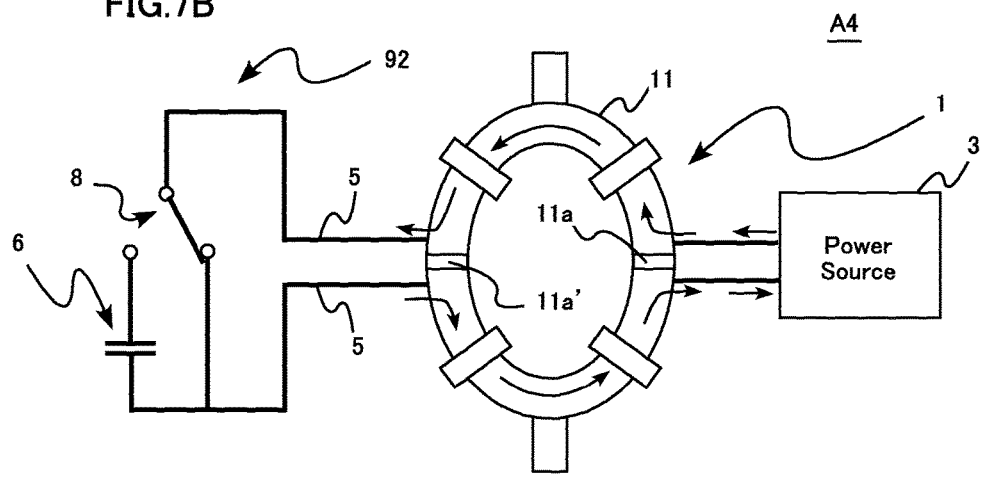

FIG. 7B is a simplified conceptual diagram showing the entirety of a plasma generation apparatus according to the fourth embodiment. In FIG. 7B, elements that are the same as or similar to those of the plasma generation apparatus A2 according to the second embodiment (see FIG. 6A) are denoted by the same reference signs. As shown in FIG. 7B, the plasma generation apparatus A4 differs from the plasma generation apparatus A2 according to the second embodiment in that instead of the capacitor 6, a circuit 92 for switching between a state of being connected to the capacitor 6 and a short-circuiting state is connected.

The circuit 92 includes the single-pole double-throw switch 8 and uses the switch 8 to switch between a state in which the capacitor 6 is connected to the connection lines 5 and a state in which the connection lines 5 are short-circuited. The capacitor 6 is similar to the capacitor 6 according to the second embodiment, and is a capacitor whose reactance is one half of the reactance of the chamber 1 in the state after the plasma has been generated. Before the plasma is generated, the switch 8 is switched to the state in which the connection lines 5 are short-circuited (state shown in FIG. 7B), and after the plasma is generated, the switch 8 is switched to the state in which the capacitor 6 is connected to the connection lines 5. Note that the switching of the switch 8 is performed in a manner similar to that of the third embodiment.

In the fourth embodiment, after the plasma is generated, the capacitor 6 enters a state of being connected, and since a configuration similar to that of the second embodiment is used, an effect similar to that of the second embodiment can be achieved. Also, before the plasma is generated, the connection lines 5 are short-circuited, and a state is entered in which the insulating gap 11a' is short-circuited. In this case, the impedance viewed from the high-frequency power source 3 is only the reactance of the chamber 1, and the output voltage of the high-frequency power source 3 is directly applied between the two ends of the insulating gap 11a. Accordingly, a high voltage is applied between the two ends of the insulating gap 11a, and it is easy to ignite the plasma.

Note that instead of the circuit 92, it is possible to use a circuit obtained by connecting, in parallel, the capacitor 6 and switch 7, which are connected in series, and the switch 7' (a circuit in which short-circuiting occurs in the circuit 91 shown in FIG. 7A, instead of the capacitor 6'). Also, instead of the circuit 92, it is possible to use a circuit obtained by connecting the capacitor 6 and the switch 7 in parallel. In this case, when the switch 7 is turned on, the short-circuiting state is entered, and when the switch 7 is turned off, the capacitor 6 enters the connected state.

Figure 7C:
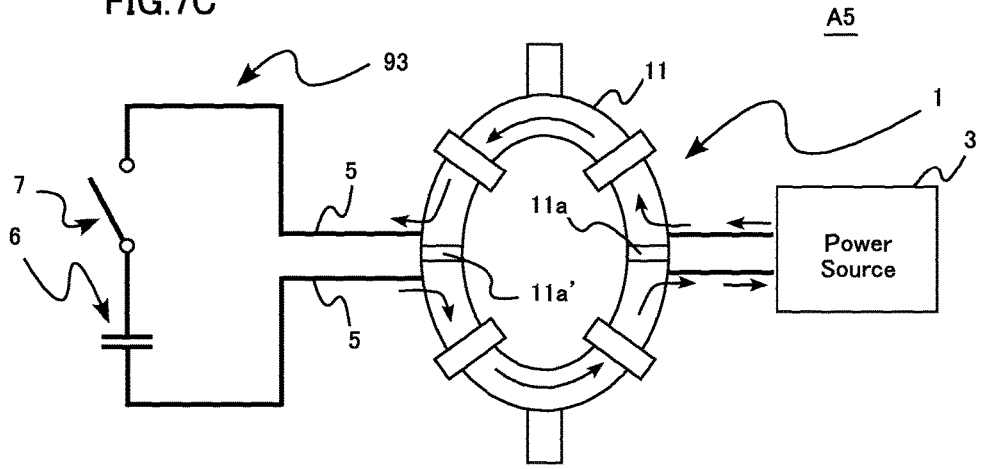

FIG. 7C is a simplified conceptual diagram showing the entirety of a plasma generation apparatus according to the fifth embodiment. In FIG. 7C, elements that are the same as or similar to those of the plasma generation apparatus A2 according to the second embodiment (see FIG. 6A) are denoted by the same reference signs. As shown in FIG. 7C, the plasma generation apparatus A5 differs from the plasma generation apparatus A2 according to the second embodiment in that the switch 7, which is connected in series to the capacitor 6, is added.

The circuit 93 is such that the capacitor 6 and the switch 7 are connected in series. The capacitor 6 is similar to the capacitor 6 according to the second embodiment, and is a capacitor whose reactance is one half of the reactance of the chamber 1 in the state after the plasma has been generated. The switch 7 is off before the plasma is generated, and is on after the plasma is generated. That is, before the plasma is generated, a state is entered in which the two connection lines 5 are disconnected (state shown in FIG. 7C), and after the plasma is generated, the capacitor 6 enters a state of being connected to the main body 11 of the chamber 1 by the connection lines 5. Note that the switching of the switch 7 is performed in a manner similar to that of the third embodiment.

In the fifth embodiment, after the plasma is generated, the capacitor 6 enters a state of being connected, and since a configuration similar to that of the second embodiment is used, an effect similar to that of the second embodiment can be achieved. Also, before the plasma is generated, the two connection lines 5 are disconnected, and the impedance viewed from the high-frequency power source 3 approaches infinity. In this case, the output voltage of the high-frequency power source 3 is directly applied between the two ends of the insulating gap 11a'. Accordingly, if the non-load voltage of the high-frequency power source 3 is sufficiently large, a high voltage is applied between the two ends of the insulating gap 11a', and it is easy to ignite the plasma.

The plasma generation apparatus according to the present invention is not limited to the above-described embodiments. The specific configurations of the units of the plasma generation apparatus according to the present invention can be designed and modified in various ways.

The invention claimed is:

1. A plasma generation apparatus, comprising:
a chamber made of an electroconductive material and having a toroidal-shaped electrical discharge space; and
a power source connected to the chamber for causing a current to flow through the electroconductive material of the chamber along a toroidal direction,
wherein the chamber is provided with a first insulating portion and includes a first portion and a second portion that are electrically insulated from each other in the toroidal direction via the first insulating portion,
the first portion and the second portion of the chamber are spaced apart from each other in the toroidal direction via a gap,
a relay adapter for defining a size of the gap,
the first portion of the chamber is provided with a first external flange, and the second portion of the chamber is provided with a second external flange, and
the relay adapter is disposed between the first external flange and the second external flange in the toroidal direction.

2. The plasma generation apparatus according to claim 1, further comprising a first connecting line and a second connecting line, wherein the power source is provided with a first output terminal and a second output terminal, the first connecting line connects the first output terminal to the first portion of the chamber, and the second connecting line connects the second output terminal to the second portion of the chamber.

3. The plasma generation apparatus according to claim 1, wherein the chamber is made of a metal.

4. The plasma generation apparatus according to claim 1, further comprising a magnetic core that surrounds a portion of the chamber.

5. The plasma generation apparatus according to claim 1, wherein the relay adapter is formed with a through-hole extending in the toroidal direction, and the first portion and the second portion of the chamber are inserted into the through-hole.

6. The plasma generation apparatus according to claim 1, further comprising a sealing ring held in close contact with both the relay adapter and the chamber.

7. The plasma generation apparatus according to claim 1, wherein the chamber is provided with a second insulating portion, and the chamber includes two end portions that are electrically insulated from each other in the toroidal direction via the second insulating portion.

8. The plasma generation apparatus according to claim 7, further comprising a capacitor connected between the two end portions of the chamber, wherein the capacitor has a reactance that is about one half of a reactance of the chamber in a state after plasma has been generated.

9. The plasma generation apparatus according to claim 7, further comprising a first capacitor, a second capacitor and a switch that are disposed between the two end portions of the chamber,
wherein the switch connects selectively one of the first capacitor and the second capacitor to the chamber,
the first capacitor has a reactance that is about one half of a reactance of the chamber in a state after plasma has been generated, and the second capacitor has a reactance that is substantially equal to a reactance of the chamber in a state before plasma is generated.

10. The plasma generation apparatus according to claim 7, further comprising a capacitor and a switch that are disposed between the two end portions of the chamber,
wherein the switch selectively causes the capacitor to be connected to the chamber or the two end portions to be shorted to each other,
the capacitor has a reactance that is about one half of a reactance of the chamber in a state after plasma has been generated.

11. The plasma generation apparatus according to claim 7, further comprising a capacitor and a switch that are disposed between the two end portions of the chamber,
wherein the switch is connected to the capacitor in series, and the capacitor has a reactance that is about one half of a reactance of the chamber in a state after plasma has been generated.

12. The plasma generation apparatus according to claim 1, further comprising an irradiation device for emitting an ultraviolet ray to the electrical discharge space.

\* \* \* \* \*